United States Patent [19]

Grissonnanche

[11] 4,201,981

[45] May 6, 1980

[54] DEVICE FOR THE DISPLAY OF DATA REPRESENTATIVE OF QUANTITIES

[75] Inventor: Jean L. Grissonnanche, Le Pecq, France

[73] Assignee: Societe Francais d'Equipements pour la Navigation Aerienne, Velizy-Villacoublay, France

[21] Appl. No.: 904,751

[22] Filed: May 11, 1978

[30] Foreign Application Priority Data

May 18, 1977 [FR] France .................................. 77 15337

[51] Int. Cl.² ................................................ G08B 5/00
[52] U.S. Cl. ................................. 340/380; 340/366 F
[58] Field of Search ............ 340/380, 323, 381, 366 F

[56] References Cited

U.S. PATENT DOCUMENTS

| | | | |
|---|---|---|---|
| 3,506,836 | 4/1970 | Rueger | 340/380 |
| 3,638,215 | 1/1972 | Payne | 340/323 |
| 3,647,986 | 3/1972 | Lace | 340/380 |
| 3,726,250 | 4/1973 | Merk | 340/380 |

FOREIGN PATENT DOCUMENTS 1223769   3/1971   United Kingdom ...................... 340/380

Primary Examiner—Harold I. Pitts
Attorney, Agent, or Firm—Scully, Scott, Murphy & Presser

[57] ABSTRACT

A display instrument for aircraft wherein a representation of a data value is recorded and indicated by the position of an illuminated bar alongside a graduated scale. A number of bars are located along the scale, each bar being formed by the emitting end of a respective bundle of optical fibres. A particular bundle is illuminated to illuminate its bar according to a digital value stored in a counting register. This value is variable by the manual rotation of a knob driving an apertured disc so that each time a light beam passes through an aperture as the disc rotates, the beam is incident on an opto-electronic receiver, thus, providing a signal which changes the value stored in the counting register.

8 Claims, 2 Drawing Figures

U.S. Patent May, 6, 1980 4,201,981

DEVICE FOR THE DISPLAY OF DATA REPRESENTATIVE OF QUANTITIES

BACKGROUND OF THE INVENTION

The present invention relates to a device for the display of data representative of quantities such as for example reference values, results of calculations or even measurement values.

Generally, there are currently two main types of display devices of this type, namely so-called analog display devices and so-called digital display devices.

Analog display devices which most frequently consist of a graduated dial and a reference mark able to move one with respect to the other, have numerous advantages.

Primarily, they make it possible to provide the operator not only with the purely abstract value of the quantity displayed, but with a concrete representation of this value which is provided by the position and behaviour of the reference mark with respect to the graduation of the dial and/or with respect to reference members, of very varied type, appearing on the dial or outside the latter.

However, the main drawback of these systems emanates from the fact that they use electro-mechanical processes which are generally slow and delicate and which are ill-suited to digital processing systems since they are based on analog signals.

Digital display devices which make it possible to obtain a direct display in numbers, may be more accurate and require no extrapolation, which would be the case for example when in an analog display device, the reference mark indicates a value comprised between two graduations (in fact, in a digital device, it is possible to provide a number of decades corresponding to the required accuracy).

These systems also have the advantage of requiring only electronic or opto-electronic devices, thus excluding any electro-mechanical device.

However, it is only possible to obtain abstract values with these systems and this is excluding any other indication for example facilitating a rapid evaluation of what these values represent themselves and with respect to reference members which are significant for the operator.

Furthermore, even if these digital systems provide incomparable results in the display of a fixed quantity, for example the result of a mathematical operation, this is not so as regards the display of a quantity varying with respect to time. In fact, continual or repeated flashing of the last decade of the numbers displayed makes reading of the value at a given instant difficult and constitutes a hidrance to the operator.

This drawback is all the more considerable since in a general manner operators assigned to supervising a process, or even pilots, in the case of flying an aerodyne, must pay attention to any flashing of a light. In fact, flashing of this type must frequently indicate the presence of a breakdown, an anomaly or the starting point of an operation which the operator or pilot must carry out.

Furthermore, on account of the absence of a reference member, these digital devices do not allow the operator to estimate quantitatively or qualitatively a variation in the quantity measured (quantitative estimation possibly being the estimation of a deviation and qualitative estimation possibly being the variation speed).

The invention therefore relates to a display system which makes it possible to combine the advantages of the two aforementioned types of display system.

SUMMARY OF THE INVENTION

To this end, the display device according to the invention essentially comprises a numbered graduation and a luminous indicator generated by digital signals and able to assume different positions along said graduation.

This indicator may advantageously be produced by means of the emitting ends of a plurality of bundles of optic fibres. In this case, the emitting ends of each of the bundles are arranged in the shape of rods, the rods produced in this way being located one above the other in order to form a scale parallel to said graduation. An addressable light source corresponds to each of the bundles of optic fibres.

In a similar manner, this indicator could be generated by a single light source illuminating one line matrix of cells comprising liquid crystals, the polarization state of each of the cells being able to be addressed in a manner similar to the former.

Naturally, for certain applications, it is possible to place side-by-side the various scales generating indicators representative of different quantities. In this case, one indicator may serve both for the display of a quantity and consist of the reference member of the indicator which is adjacent thereto.

Such a juxtaposition allows the operator, at a single glance, to carry out an observation and instinctive evaluation of a high number of quantities.

To this end, it is preferable to provide that for normal operation, all the quantities are displayed by means of indicators located at the same level.

The invention also relates to a system for the display of reference values in a process such as for example an automatic flying system for an aerodyne.

According to another feature of the invention, this system comprises for controlling the display, a manual member such as a knob or knurled wheel and a display device proper facilitating the visualization of a value corresponding to the action exerted on said manual member.

As afore-mentioned, the display member comprises a graduation and a luminous indicator generated from digital signals and which is able to assume different positions along said graduation.

BRIEF DESCRIPTION OF THE DRAWING

One embodiment of the invention will be described hereafter as a non-limiting example, referring to the accompanying drawings in which.

DESCRIPTION OF THE PREFERRED EMBODIMENT

Figure 1:
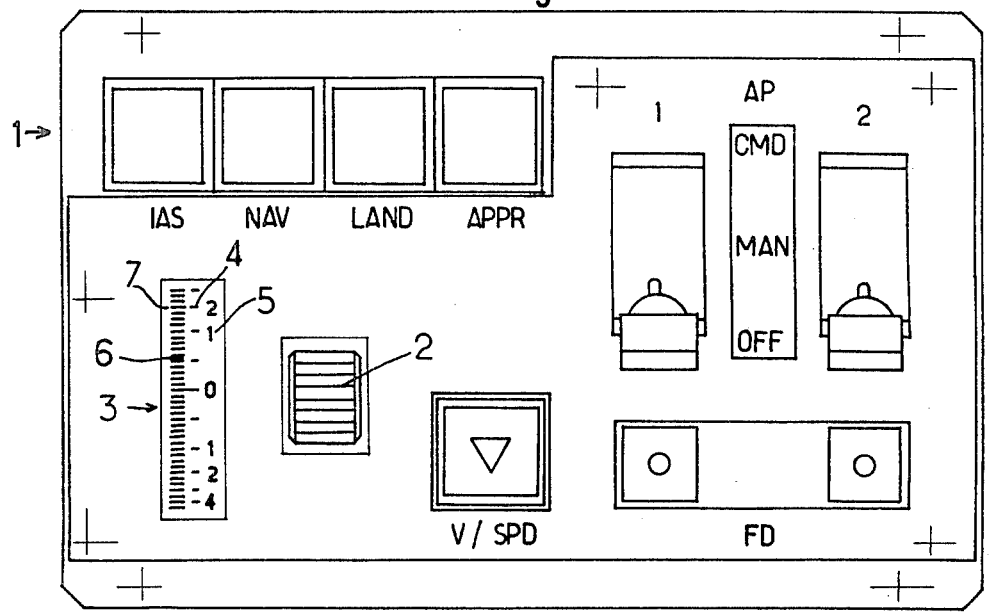
FIG. 1 is a diagrammatic front view of the control panel of an automatic flying module.

In FIG. 1, amongst the control and indication members of the automatic flying module 1, the system for displaying the reference value corresponding to the flying method used comprises:

a manual member for controlling the display which consists of a knurled wheel 2 mounted loosely and a display member proper 3 comprising firstly a graduation 4 along which the various numbers 5 associated with said graduation 4 are inscribed on one side and secondly, on the other side of said graduation, a luminous indicator 6 able to move along a scale 7 located against the graduation 4.

Figure 2:
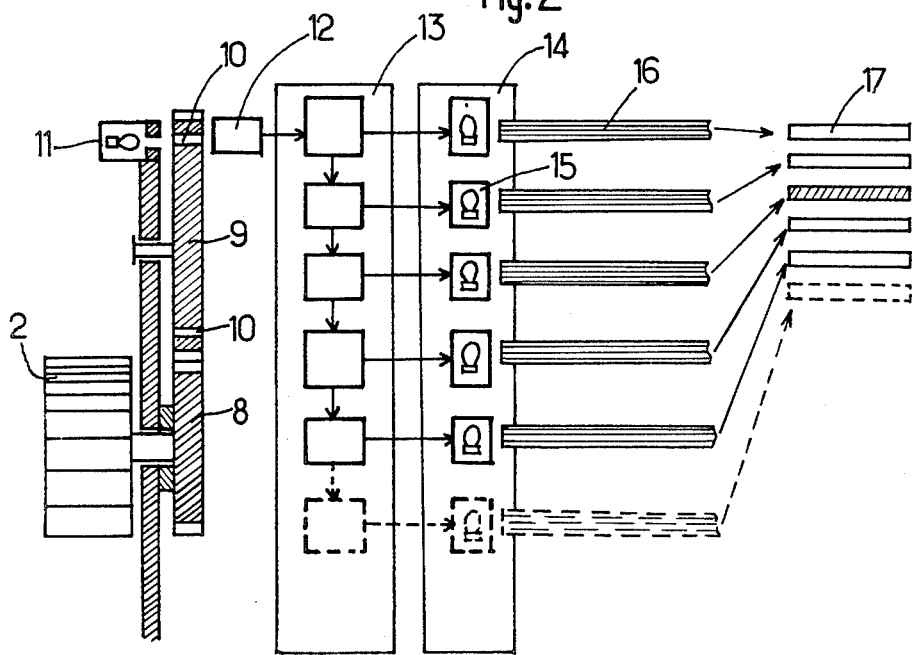
FIG. 2 is a theoretical block diagram of a display system according to the invention.

As shown in FIG. 2, by means of gearing 8, the knurled wheel drives a disc 9 comprising a series of holes 10 along its circumference. Located on either side of this disc 9 and at the height of said openings 10 are a light source 11 and an opto-electronic receiver 12 respectively, which changes its state or emits an electrical pulse each time it is illuminated. This receiver 12 is in turn connected to a counting register 13 which is in turn connected to a set of lamps 14 such that the illumination of one lamp 15 corresponds in succession and in an ordered manner to each change of state or to each pulse.

Located in the vicinity of each of the lamps 15 is the receiving end of a bundle of optic fibres 16 whose emitting end is in the form of a bar 17. The emitting ends of the bundles 16 are superimposed in order to produce the scale 7 shown in FIG. 1.

Thus, when the knurled wheel 2 is rotated in one direction, each time a hole 10 passes between the light source 11 and the detector 12, the latter changes state such that this change of state causes the counting register to advance by one row and causes the extinction of the bar previously illuminated and the illumination of the following bar. By a reverse process and by using a system for detecting the direction of rotation of the knurled wheel, the counting register moves back by one row for each change of state caused by a reverse rotation of the knurled wheel, which causes the illumination of the preceding bar.

One important advantage of this device consists in that instead of generating an analog signal as would be the case if a potentiometer or a synchro-device were associated therewith, the knurled wheel makes it possible to produce a digital signal which can be used directly by a digital processing member.

It will be noted that in order to allow the operator better instinctive evaluation of the value displayed, the graduation of the display device proper 3 may have a form similar to that which the operator would see if the knurled wheel were graduated directly. Furthermore, the graduation may be coloured to conform with visual references of the outside world. In the example illustrated, which relates to the flying of an aerodyne, the lower part of the graduation is coloured grey, whereas the upper part is coloured blue. In a similar manner, by using optical filters arranged in an appropriate manner, it is possible to obtain bars of different colours.

Similarly, for reasons of operating safety, the indicator may consist of the illumination of two consecutive bars of the scale 7 such that if one of the two lamps serving to generate the indicator becomes inoperative, the indicator is still partly generated. This arrangement has the advantage of locating the fault instantaneously.

It is obvious that by means of the afore-described device, the setting of a reference value may be carried out under the best conditions and without requiring particular attention on the part of the operator.

Moreover, this device advantageously makes it possible to re-create a certain degree of inaccuracy which, paradoxically, constitutes one of the advantages of the analog systems, in the sense that it provides:

ease of adjustment of a quantity,
agreement of the values displayed by two separate devices, of the same quantity.

What is claimed is:

1. A system for indicating values, such as the values of command in a process or in a system of automatic piloting of an aircraft, comprising:
   (a) a manual element, such as a rotatably mounted knob, for commanding an indicator;
   (b) means, responsive to the action effectuated on said manual element, for transforming the information into a succession of pulses;
   (c) means for counting said pulses;
   (d) an indicator means, responsive to said counting means and comprising a luminous index having graduations along its length to indicate an output reading, and where the output reading is a function in amplitude of the count in said counting means and in direction of the direction of action effectuated on said manual element, whereby an indication is supplied to the operator through the intermediary of the manual element, with the indication being comparable to a reference for an output reading.

2. A system according to claim 1 in which said indicator means generates an indication by the emitting ends of a plurality of bundles of optical fibers arranged in superimposed rows to form a scale, with the receiving ends of each of the bundles of optical fibers being illuminated by means of addressable light sources.

3. A system according to claims 1 or 2, characterized in that said indicator means generates an indication by means of at least one light source illuminating a matrix of liquid crystal cells, the state of polarization of which is addressable.

4. A system according to claims 1 or 2, characterized in that said indicator means generates several scales of an index associated with at least one graduation.

5. A system according to claim 4, characterized in that the index is generated by illumination of two consecutive rows.

6. A system according to claims 1 or 2, characterized in that said indicator means includes reference elements having different colorations.

7. A system according to claims 1 or 2, said manual element comprises a knob coupled to drive a disc having around its circumference a series of light transmissive apertures, with a light source on one side of said disc by said apertures and a photodetector on the other side of said disc which generates a pulse each time it is illuminated, said photodetector being coupled said counting means including a counting register coupled to a matrix of lamps for illuminating the receiving ends of a plurality of bundles of optical fibers and wherein the emitting ends of the plurality of bundles are arranged to form a scale, said counting register causing, at the receipt of a pulse from said photodetector, the ordered illumination of at least one lamp and the extinction of at least one preceding lamp.

8. A system according to claims 1 or 2, in which the said graduations have a form similar to that of a directly graduated knob.

* * * * *